PHASE REVERSIBLE SWITCHING POWER AMPLIFIER

Filed March 19, 1965

INVENTOR
THORLEIF KNUTRUD

BY Stanley M. Schurgin

ATTORNEY

United States Patent Office 3,384,838
Patented May 21, 1968

3,384,838
PHASE REVERSIBLE SWITCHING POWER AMPLIFIER

Thorleif Knutrud, Sudbury, Mass., assignor to Sylvania Electric Products Inc., a corporation of Delaware
Filed Mar. 19, 1965, Ser. No. 441,190
3 Claims. (Cl. 332—9)

ABSTRACT OF THE DISCLOSURE

Phase reversible direct current switching power amplifier. Input signals to be amplified are pulse-width modulated by pulse-width modulating apparatus to produce a series of bipolar pulses of width proportional to the magnitude of the input pulses. In response to a pulse of a negative polarity being produced by the modulation apparatus, a first transistor switch connects a source of negative direct current potential to an output connection whereby a negative pulse is applied to the output connection. For a pulse of positive polarity produced by the modulation apparatus, a second transistor switch connected to the first transistor switch connects a source of positive direct current potential to the output connection whereby a positive pulse is applied to the output connection. The pulses resulting from the alternate connections of the direct current sources are averaged whereby to produce an output signal which is linearly proportional to the input signals.

This invention relates to electronic power amplifiers and more particularly to phase reversible direct current switching power amplifiers.

Direct current power amplifiers are widely used to drive control equipment, such as servo motors. Such amplification is conventionally provided by electronic class B amplifiers or magnetic amplifiers; however, these devices suffer several disadvantages. The class B amplifiers are rather inefficient and are large and cumbersome in high power versions, and magnetic amplifiers are very inefficient and, in addition, have slow response characteristics. In an attempt to overcome these disadvantages, switched transistor amplifiers have been developed wherein power transistors are switched on and off in response to control pulses to provide an amplified output signal. Amplification is obtained by using a low power signal to control the width, and therefore the power, of the output pulses. While these present switched amplifiers are satisfactory for some purposes, they are unsuitable for many applications such as in a servo control system. These amplifiers are non-reversible, that is, they provide output pulses of only a single polarity, which make them of little value in servo systems and, they are, in addition, non-linear and unstable.

It is, therefore, an object of the present invention to provide a simple and efficient reversible power amplifier employing switched transistor techniques which is especially useful in servo systems.

Other objects of the invention are to provide a power amplifier having good linearity and stability, and capable of providing bi-polar pulses.

In accordance with the present invention, a low power pulse width modulator controls an electronic switch which is selectively connected to a positive and a negative source of direct current energy. A signal to be amplified controls the width of the output pulses from the pulse width modulator and these pulses control the operation of the switch to connect to the positive direct current source when the signal is positive and to the negative direct current source when the signal is negative. The pulses resulting from the alternate connection to the direct current sources are then averaged to produce an output voltage which is linearly proportional to the input signal.

The invention will be more fully understood from the following detailed description, taken in conjunction with the accompanying drawings, in which.

Figure 1:
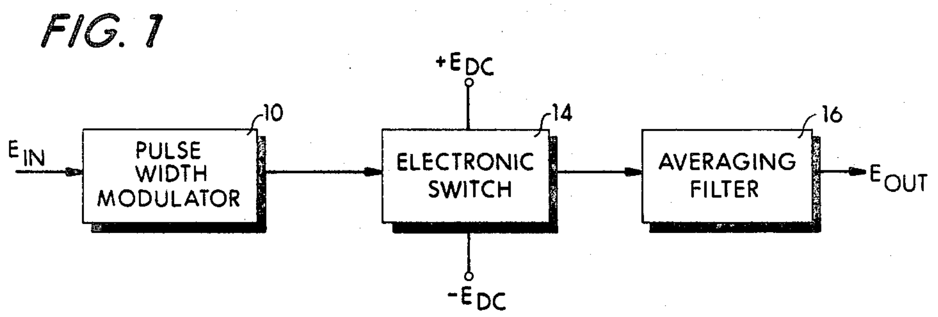
FIG. 1 is a block diagram representation of the present invention.
Figures 2, 3:
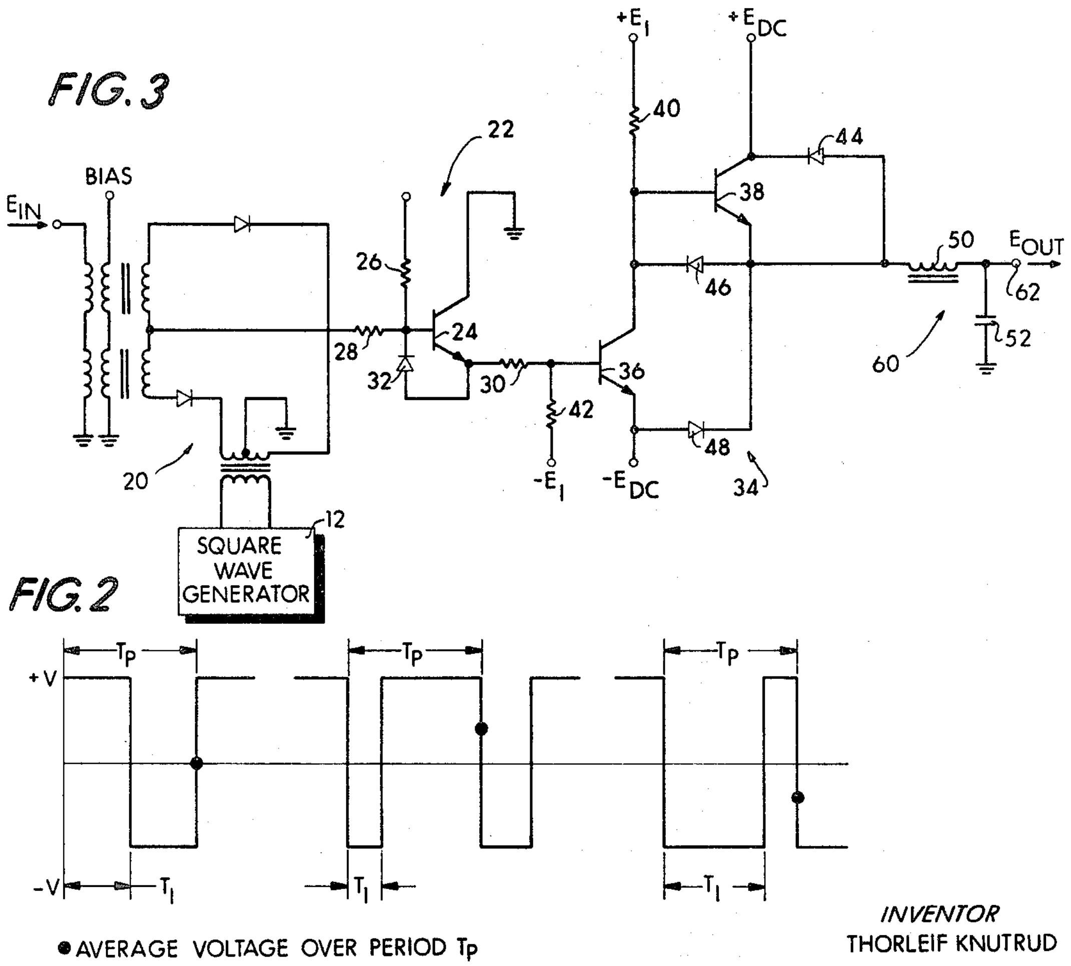
FIG. 2 is a plot of output voltage vs. time useful in explaining the operation of the invention.
FIG. 3 is a schematic circuit diagram of one embodiment of the invention.

Referring to FIG. 1, there is shown a switching power amplifier which includes a pulse width modulator 10, an electronic switch 14, and an averaging filter 16. Pulse width modulator 10 is energized by an input signal from a source of input signals $E_{IN}$, which input signal can be alternating current or direct current depending upon the type of modulator employed, to produce a series of bipolar pulses of a width depending upon the magnitude of the input signal, as depicted in FIG. 2. The portion $T_1$ of the total period $T_p$ is linearly proportional to the magnitude of the input signal, and determines the average magnitude of the waveform over the period $T_p$. In FIG. 2, three waveforms are shown which are exemplary of an output signal having zero, positive and negative average potential, respectively. These bipolar pulses are applied to an electronic switch 14 which is operative in response thereto alternately to connect to a source of positive direct current potential $+E_{DC}$, or a source of negative direct current potential $-E_{DC}$, according to the polarity of the applied pulse. The positive source is connected when the applied pulse is positive, and the negative source connected when the pulse is negative. A series of bipolar pulses, of the form illustrated in FIG. 2, are thereby produced, which are an amplified version of the bipolar pulses formed by the pulse width modulator. The amplified bipolar pulses are applied to an averaging filter 16 which time averages them to produce an amplified, phase reversible, direct current signal $E_{OUT}$ which is linearly proportional to the input signal from the source of input signals $E_{IN}$.

An implementation of the block diagram of FIG. 1 is illustrated in FIG. 3. Phase width modulation is accomplished with a magnetic amplifier shown generally at 20, the detailed operation of which is well known. The magnetic amplifier is suitably biased by a bias source and is energized by a direct current input signal from the source $E_{IN}$ and a square wave from the square wave generator 12, to produce a train of pulse-width modulated pulses which activate a driver stage 22 including a transistor 24, resistors 26, 28 and 30 and a diode 32 connected between the emitter and base of transistor 24. The driver provides the necessary gain to drive transistor switch 34.

The transistor switch includes transistors 36 and 38 and diodes 44, 46 and 48. Transistor 36 has its emitter connected to a negative source of direct current energy $-E_{DC}$, and its collector connected to the base of transistor 38. The collector of transistor 38 is connected to a positive source of direct current potential $+E_{DC}$. Proper biasing of transistors 36 and 38 is provided by direct current sources $+E_1$ and $-E_1$ together with associated resistors 40 and 42. To minimize power dissipation, the transistors are biased to operate in saturation.

In operation, when the output signal from magnetic amplifier 20 is negative, a current is produced and flows via driver 22 into the base of transistor 36, causing the collector voltage to drop to a magnitude close to $-E_{DC}$ which, in turn, cuts off transistor 38. Transistor 36 is cut off by driving its base more negative than $-E_{DC}$, by a suitable current from the magnetic amplifier, at which time the potential at the base of transistor 38 rises toward $+E_1$, until transistor 38 conducts, causing connection to $+E_{DC}$. Diode 46 provides a negative bias to assure cut off of transistor 38 during the conduction of transistor 36. Diodes 44 and 48 are provided to share some of the inductive current due to filter choke 50, and any other inductance that is present in the utilization circuit. In brief, inductive current which flows ino the load when transistor 38 is conducting is carried by transistor 38 until transistor 36 is fully conducting, at which time diode 48 carries this current. Similarly, a reverse inductive current which flows when transistor 36 is conducting is carried by this transistor until transistor 38 fully conducts, at which time the current flows through diode 44 into the $+E_{DC}$ supply.

The output signal is taken from the emitter of transistor 38, and is averaged by an averaging filter 60 which consists of inductor 50 connected between the emitter of transistor 38 and output terminal 62, and a capacitor 52 connected between the output end of the inductor and ground.

It will be noted that the output voltage $E_{OUT}$ is continuous and varies linearly from one polarity to the other. Efficiencies of the order of 90% are easily attainable and zero output dissipation is less than 5% of the maximum output power. The speed of response is limited only by the switching time of the transistors; with presently available transistors, amplification is possible from DC up to several kilocycles. The degree of ripple in the output is easily controlled by suitable choice of switching speed and appropriate filtering. The present circuit, therefore, offers an improvement over conventional amplifiers which are switched at power frequencies. In addition, it should be noted that this amplifier can drive a purely inductive load, such as the stator or rotor winding of a servo motor, since inductive current is dissipated without deleterious effect.

From the foregoing, it is evident that an efficient, reversible switching power amplifier has been provided. Various modifications and alternative implementations will occur to those versed in the art without departing from the true spirit and scope of the invention. For example, the pulse width modulator, electronic switch and averaging filter can take a variety of forms. Accordingly, the invention is not to be limited by what has been particularly shown and described, except as indicated in the appended claims.

I claim:

1. A phase reversible switching power amplifier comprising, a source of positive direct current potential, a source of negative direct current potential, a source of input signals to be amplified, a pulse width modulator operative in response to said input signals to produce a series of bipolar pulses of width proportional to the magnitude of said input signals, a transistor switch including first and second transistors each having a base, an emitter and a collector, the base of said first transistor being connected to said pulse width modulator and through a first resistor to a source of negative bias potential, the collector of said first transistor connected to the base of said second transistor and through a second resistor to a source of positive bias potential, first, second and third diodes connected, respectively, between the collector and emitter of said second transistor, the emitter and base of said second transistor, and between the emitters of said first and second transistors, the collector of said second transistor being connected to said positive source of direct current potential, the emitter of said first transistor being connected to said negative source of direct current potential, and an averaging filter connected to the emitter of said second transistor

2. A phase reversible switching power amplifier comprising:

a source of direct current potential of a first polarity;
a source of direct current potential of a second polarity;
bipolar pulse circuit means adapted to receive input signals and in response to said input signals to produce a series of pulses, each pulse having a first polarity or a second polarity and a width representative of the magnitude of the corresponding input signal;
switching means including
(a) an output connection;
(b) first switching circuit means connected to said bipolar pulse circuit means and to said output connection, said first switching circuit means being operable in response to said bipolar pulse circuit means producing a pulse of the first polarity to connect said source of direct potential of said first polarity to said output connection whereby a pulse of the first polarity is produced at said output connection, and operable in response to said bipolar pulse circuit means producing a pulse of the second polarity to disconnect said source of direct current potential of the second polarity from said output connection; and
(c) second switching circuit means connected to said first switching circuit means and to said output connection, said second switching circuit means being operable to disconnect said source of direct current potential of the second polarity from said output connection in response to said first switching circuit means operating to connect said source of direct current potential of the first polarity to said output connection, and operable to connect said source of direct current potential of the second polarity to said output connection in response to said first switching circuit means operating to disconnect said source of direct current potential of the first polarity from said output connection, whereby a pulse of the second polarity is produced at said output connection; and
averaging filter means connected to said output connection and operable to receive and filter the pulses from said first and second switching circuit means whereby to produce an output signal linearly proportional to the input signals.

3. A phase reversible switching power amplifier comprising:

a source of positive direct current potential;
a source of negative direct current potential;
a pulse width modulator adapted to receive input signals and in response to said input signals to produce a series of bipolar pulses of width proportional to the magnitude of the input signals;
transistor switching means including
(a) an output connection;
(b) first transistor circuit means connected to said pulse width modulator and to said output connection, said first transistor circuit means being operable in response to said pulse width modulator producing a pulse of negative polarity to connect said source of negative direct current potential to said output connection whereby a pulse of negative polarity is produced at said output connection, and operable in response to said pulse width modulator producing a pulse of positive polarity to disconnect said source of negative direct current potential from said output connection; and
(c) second transistor circuit means connected to said first transistor circuit means and to said output connection, said second transistor circuit means being operable to disconnect said source of positive direct current potential from said output connection in response to said first transistor circuit means operating to connect said source of negative direct current potential to said output connection, and operable to connect said source of positive direct current potential to said output connection in response to said first transistor circuit means operating to disconnect said source of negative direct current potential from said output connection, whereby a pulse of positive polarity is produced at said output connection; and averaging filter means connected to said output connection and operable to receive and filter the pulses from said first and second transistor circuit means whereby to produce an output signal linearly proportional to the input signals.

References Cited

UNITED STATES PATENTS

| | | | |
|---|---|---|---|
| 2,842,683 | 7/1958 | Clapper | 307—88.5 |
| 2,990,516 | 6/1961 | Johannessen | 332—12 X |
| 3,072,854 | 1/1963 | Case | 332—9 X |
| 3,112,365 | 11/1963 | Kihara | 332—9 X |

ALFRED L. BRODY, *Primary Examiner.*